United States Patent [19]
Fuse et al.

[11] Patent Number: 6,052,189
[45] Date of Patent: *Apr. 18, 2000

[54] HEIGHT MEASUREMENT DEVICE AND HEIGHT MEASUREMENT METHOD

[75] Inventors: Takashi Fuse; Hiroyuki Tsukahara; Yoshitaka Oshima; Youji Nishiyama; Fumiyuki Takahashi, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/909,017

[22] Filed: Aug. 11, 1997

[30] Foreign Application Priority Data

Dec. 16, 1996 [JP] Japan .................................. 8-335458
May 20, 1997 [JP] Japan .................................. 9-129560

[51] Int. Cl.⁷ .................................................... G01B 11/00
[52] U.S. Cl. .......................................... 356/375; 356/376
[58] Field of Search .................................. 356/237, 394, 356/375, 376, 243, 237.1, 237.2, 237.4; 348/87, 92, 125, 126; 250/201.2, 559.22, 559.29

[56] References Cited

U.S. PATENT DOCUMENTS

| | | | |
|---|---|---|---|
| 4,209,252 | 6/1980 | Arditty et al. | 356/124 |
| 4,743,771 | 5/1988 | Sacks et al. | 356/376 |
| 5,394,100 | 2/1995 | Bohler et al. | 324/758 |
| 5,450,206 | 9/1995 | Caillat et al. | 356/237 |
| 5,465,152 | 11/1995 | Bilodeau et al. | 356/237 |

*Primary Examiner*—Hoa Q. Pham
*Attorney, Agent, or Firm*—Staas & Halsey, LLP

[57] ABSTRACT

The object of the present invention is to provide a height measurement device that can accurately measure the height of an object to be measured, and that can easily and precisely adjust the focal point of an optical system. According to the present invention, a height measurement device, which forms an image of a light point generated by a light source on a surface of a measured object via an irradiation side focusing lens, which forms an image of the formed image of the light point on a light point position detector via a light reception side focusing lens, and measures a height of the measured object according to the light point position on the light point position detector, comprises: a stage perpendicularly movable with the measured object mounted thereon; a camera for obtaining a light point image formed on a target face on the stage; and a controller for detecting a position of the stage or of the radiation focusing lens as a focal point, at which a light quantity on a predetermined pixel in the light point image obtained by the camera becomes a maximum level, while moving the stage or the irradiation side focusing lens.

13 Claims, 18 Drawing Sheets

OUT OF FOCUS A, C

FOCUS POINT B

Refected light axial direction

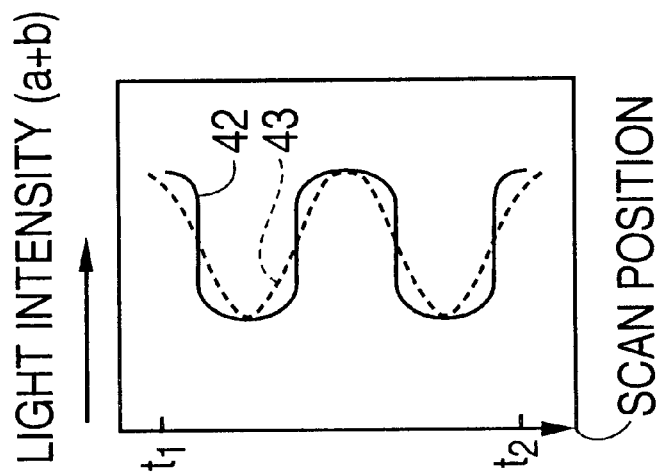
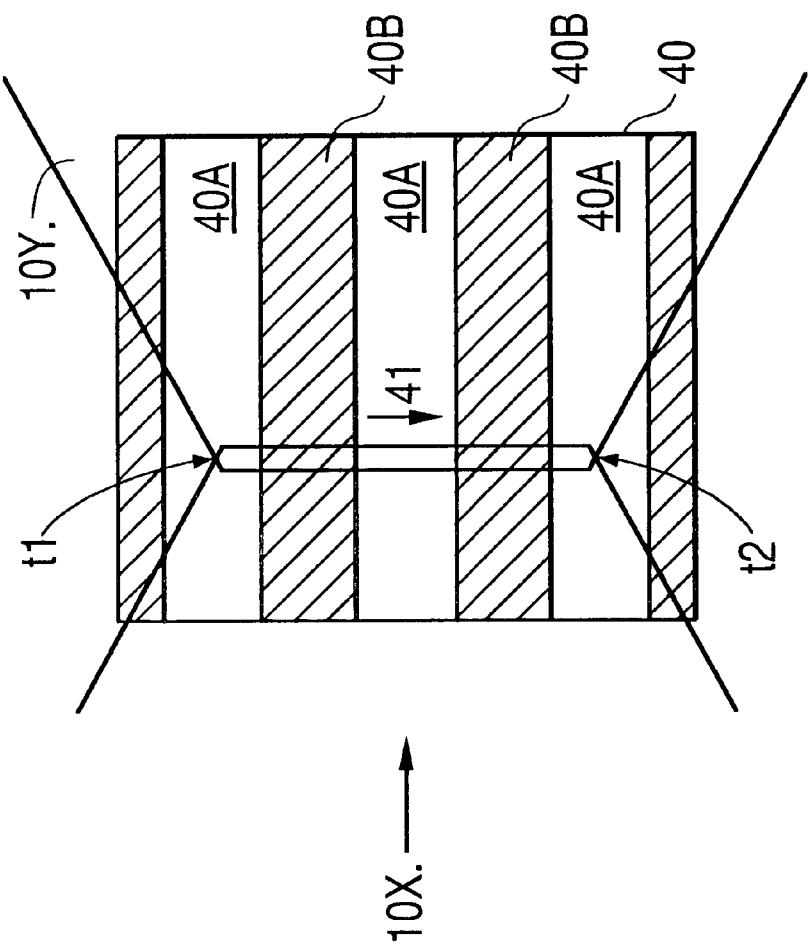

FIG. 19A
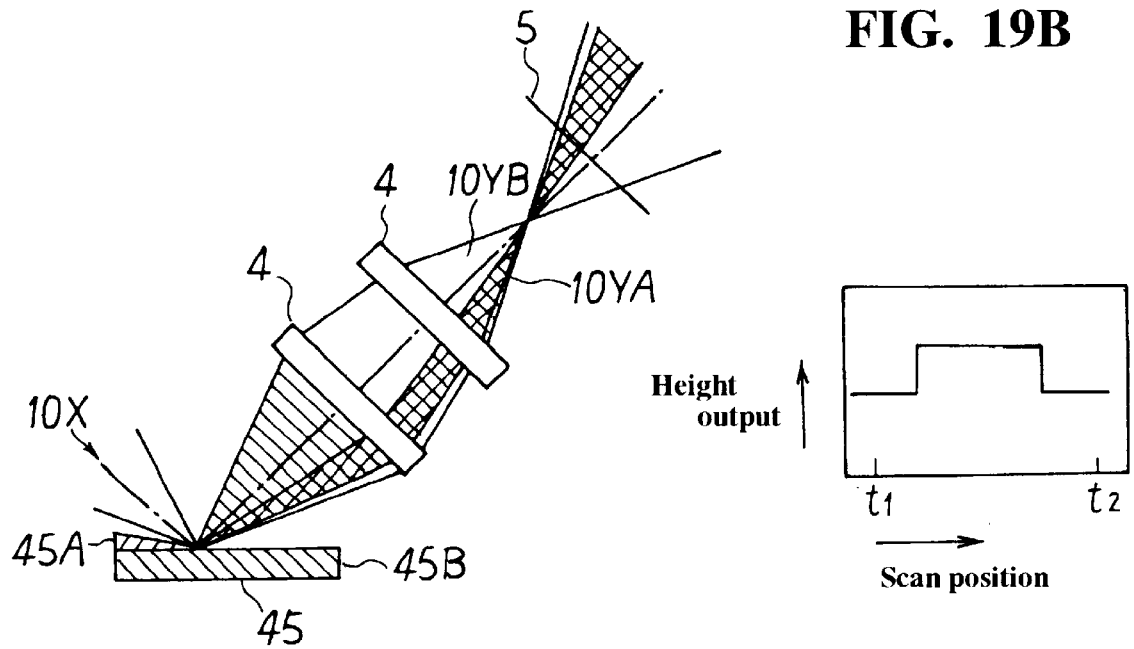
FIG. 19B
FIG. 20
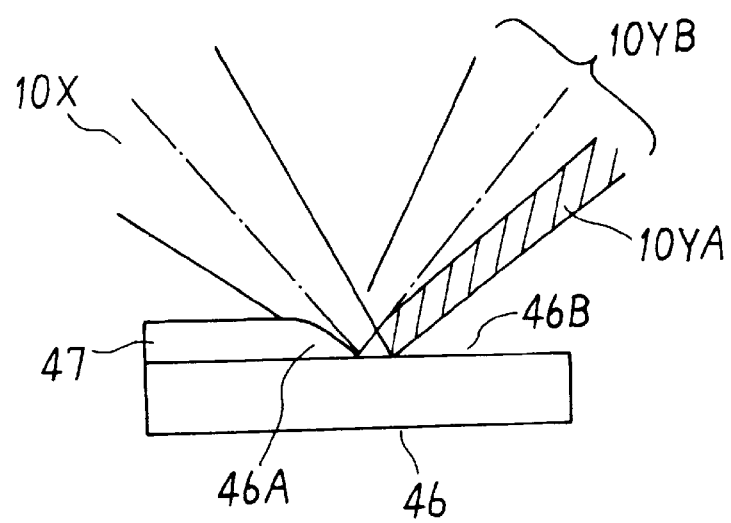

HEIGHT MEASUREMENT DEVICE AND HEIGHT MEASUREMENT METHOD

BACKGROUND OF THE INVENTION

1. Field of the Invention

The present invention relates to a height measurement device and to a height measurement method, and in particular to an improvement for a portion for adjusting an optical focal point.

2. Related Arts

A plurality of bump terminals, employed as input/output terminals, are arranged in a matrix on a surface of a semiconductor chip and the semiconductor chip is bonded face down to a substrate. Such a semiconductor chip is called a flip-chip, and is employed for a multi-chip module.

Generally, the bump terminals, which are spherical and are formed on electrodes on the surface of a semiconductor substrate, are, for example, soldering bumps formed by a soldering dip method, or metal bump terminals formed by a plating method.

When a chip on which a plurality of bump terminals are formed is bonded face down to a substrate, the individual bump terminals must be correctly aligned with corresponding electrodes on the substrate. Therefore, the bumps on the chip must have a uniform size and height. If the height of one of the bumps were to be less than that of the others, a defective connection would occur when the bumps were brought into contact with the electrodes on the substrate. Likewise, if the height of one bump were to be greater than that of the others, that bump would be larger than the others, and it could cause a short-circuit by contacting adjacent bumps during the bonding procedure.

Generally, therefore, the heights of the bumps on the surface are examined before a flip-chip is bonded to a substrate. The common height inspection method is a triangulation method whereby to detect the heights of bumps the surface of a semiconductor substrate is irradiated with light, and the reflected light forms an image on a split photodiode or a PSD (Position Sensitive Detector) to detect the heights of the bumps. Thus, a laser beam scans the surface and the heights of the bumps are determined in accordance with the locations from which light is reflected.

FIG. 23 is a diagram showing the principle of the triangulation method. An example for examining the height of a bump terminal 2, which is an input/output terminal formed on the surface of a semiconductor chip 1, an object to be measured. A laser beam 7, an irradiated light, passes through a focusing lens 3 on the irradiation side and forms an image either on the top of the bump 2 or on the surface of the chip 1, which is the object to be measured. Light reflected from the object to be measured passes through a focusing lens 4 on the light reception side and forms an image on a PSD (Position Sensitive Detector) 5, which is a light point position detection device. The height of the bump terminal 2 is detected by employing the relationship between an image forming point 2a on the PSD 5 when the top of the bump terminal 2 is irradiated and an image forming point 1a when the surface of the chip 1 is irradiated.

To increase the accuracy of the height measurement, however, the focus of the optical system on the irradiation side must be so adjusted that the laser beam used for irradiation forms an image on the surface of an object placed at the focal point. This is especially true since the top of the bump terminal is spherical and if the focal point is not on the top, a light point image formed on the top is blurred, so that the quantity and the density of reflected light are reduced. A reduction in the light quantity degrades the detection accuracy of the PSD 5.

Similarly, the focusing of the optical system on the reflection side must be so adjusted that the surface of the PSD 5 becomes the focal point for the reflected light. This is important because the light quantity and density at the point where light forms an image on the surface of the PSD 5 are increased and the sensitivity of the PSD 5 is thereby enhanced.

Therefore, conventionally, a stage on which an object to be measured is mounted, a focusing lens and a PSD are arranged at positions acquired from the specifications for a lens, etc., to constitute an optical system. With this method, however, the focal point is slightly changed because it is shifted due to lens crossovers and because of the arrangement provided less accuracy, and it is difficult to accurately measure the height of a bump terminal.

SUMMARY OF THE INVENTION

It is, therefore, one object of the present invention to provide a height measurement device and process that can accurately measure the height of an object to be measured.

It is another object of the present invention to provide a height measurement device and process that can easily and precisely adjust the focal point of an optical system.

To achieve the above objects of the present invention, a height measurement method, wherein an image of a light point generated by a light source is formed on a surface of a measured object via an irradiation side focusing lens, an image of the formed image of the light point is formed on a light point position detector via a light reception side focusing lens, and a height of the measured object is measured according to the light position point on the light point position detector, comprises:

moving a perpendicularly movable stage or the irradiation side focusing lens and obtaining the light point image formed on a target face on the stage by a camera provided above the stage; and detecting a position of the stage or of said irradiation side focusing lens as a focal point location whereat a light quantity on a specific pixel of the light point image obtained by the camera becomes a maximum level, or whereat a size of the light point image becomes smallest.

To achieve the above objects of the present invention, a height measurement method, wherein an image of a light point generated by a light source is formed on a surface of a measured object via an irradiation side focusing lens, an image of the formed image of the light point is formed on a light point position detector via a light reception side focusing lens, and a height of the measured object is measured according to the light position point on the light point position detector, comprises:

deflecting a laser beam emitted by the light source and separating a zero-order light from a first-order light;

moving the light point position detector or the light reception side focusing lens in a light axial direction; and detecting a position of the light point position detector or of the light reception side focusing lens as a focal point location, whereat a maximum quantity of the zero-order light irradiates at a location, which is substantially same position as the light point location detector in the light axial direction and which is movable together with the light point location detector in the light axial direction, or whereat a size of the light point image of the zero-order light irradiated at the location becomes smallest.

To achieve the above objects, according to the present invention, the height measurement method further comprises a step of deflecting a laser beam generated by a light source and splitting the laser beam to obtain a zero-order light being employed as a light for detecting the focal point and the first-order light being employed as a light for measuring a height of the object to be examined.

According to the present invention, the strong, easily-deflected first-order light can be employed as a scanning light for height measurement, and the zero-order light, which can be acquired separately from the first-order light, can be employed as a light for focal point detection.

To achieve the above objects of the present invention, a height measurement method, wherein an image of a light point generated by a light source is formed on a surface of an object to be measured via a focusing lens on an irradiation side, an image of the formed image of the light point is formed on a light point position detector via a focusing lens on a light reception side, and a height of the object to be measured is determined in accordance with the light position point on the light point position detector, comprises:

mounting, on a perpendicularly displaceable stage, a focal point adjustment pattern including a first area having a first reflective coefficient and a second area having a second reflective coefficient lower than the first one;

scanning a light point generated by the light source across a boundary between said first and the second areas of the focal adjustment pattern, and monitoring a change in light intensity of a light point formed on the light point position detector;

detecting a position of the stage or a position of an optical system on an irradiation side whereat the change in said light intensity is most sharply defined; and measuring a height of the object at the position of the stage or at the position of said optical system on said irradiation side.

To achieve the above objects of the present invention, a height measurement method, wherein an image of a light point generated by a light source is formed on a surface of a object to be measured via a focusing lens on an irradiation side, an image of the formed image of the light point is formed on a light point position detector via a focusing lens on a light reception side, and a height of the object to be measured is determined in accordance with said light position point on the light point position detector, comprises:

mounting, on a perpendicularly displaceable stage, a focal point adjustment pattern including a first area where reflected light relative to radiated light has a first angle and a second area where reflected light has a second angle biased relative to said first angle;

scanning a light point generated by the light source along a boundary between the first and the second areas of the focal adjustment pattern, and monitoring a barycenter of a light intensity of a light point formed on the light point position detector;

detecting a focal position of the stage or an optical system on a light reception side according to the barycenter of the light intensity; and measuring a height of the object at the focal position of the stage or at the position of the optical system on said irradiation side.

According to the present invention described above, the irradiation side optical system and the light point position detector that are provided for measuring height of the object are also employed for detecting the focal position of the irradiation side and the reception side optical system.

BRIEF DESCRIPTION OF THE DRAWINGS

FIGS. 14A and 14B are diagrams for explaining one method for detecting a focal position on an irradiation side;

FIGS. 19A and 19B are diagrams for explaining the barycenter of the light intensity of the light point image detected by the light point position detector;

FIG. 20 is a diagram showing the structure where a pattern composed of a metal, such as aluminum, is formed as a focal point adjustment pattern on a silicon substrate;

DETAILED DESCRIPTION OF THE PREFERRED EMBODIMENTS

The preferred embodiments of the present invention will now be explained while referring to the accompanying drawings. It should be noted, however, that the technical range of the present invention is not limited to the following embodiments.

Figure 1:
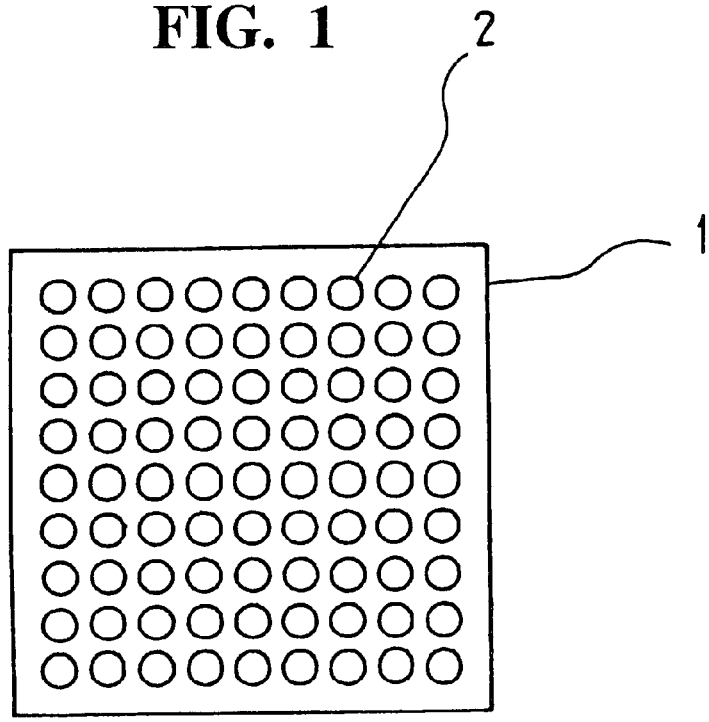
FIG. 1 is a plane view of bump terminals formed on the surface of a semiconductor chip.

FIG. 1 is a plane view of bump terminals formed on the surface of a semiconductor chip. A plurality of bump terminals 2 are arranged in a matrix on the surface of a semiconductor chip 1.

Figure 2:
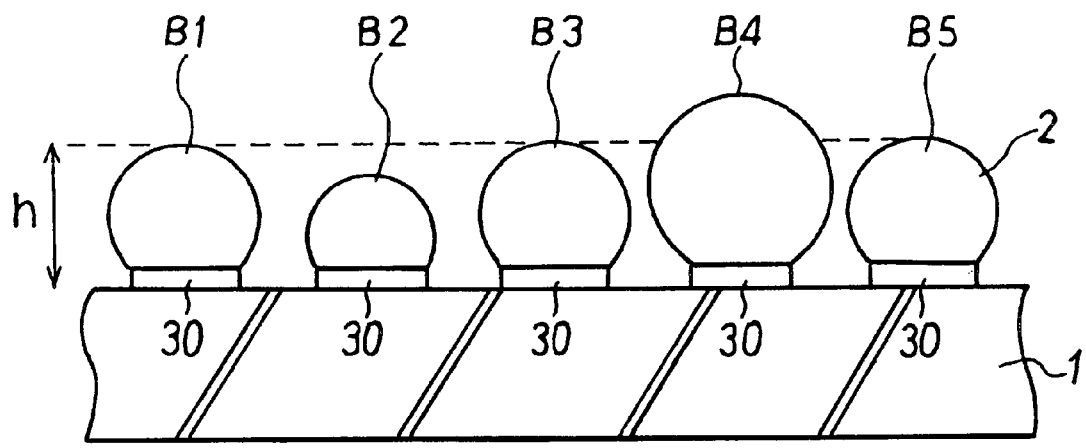
FIG. 2 is a partial cross sectional view of a semiconductor chip on which the bump terminals are formed.

FIG. 2 is a partial cross sectional view of the semiconductor chip 1 on which the bump terminals are formed. The spherical bump terminals 2 are formed on electrodes 30 on the surface of the semiconductor chip 1. In the example shown in FIG. 2, bumps B1, B3 and B5 are the correct size and have the correct height h, while bump B2 is smaller, its height being less than the correct height h, and bump 4 is larger, its height being greater than the correct height h. Since the height and the size are relative in general, whether or not a bonding failure will occur can be ascertained in advance by examining the heights of bumps to determine whether they are all the correct height value h.

Figure 3:
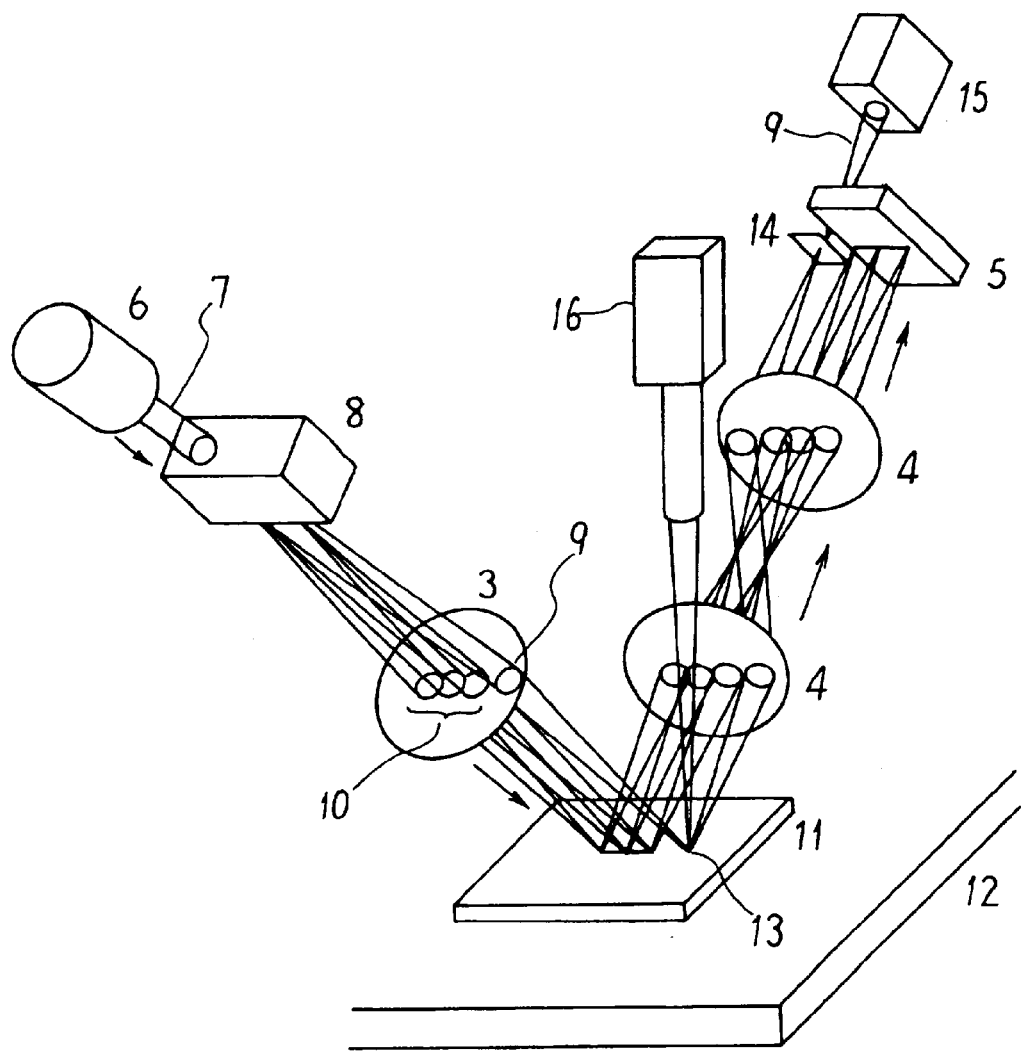
FIG. 3 is a diagram showing one embodiment of the present invention.

FIG. 3 is a diagram illustrating one embodiment of the present invention. In this embodiment, a laser beam 7 emitted by a laser light source 6 irradiates a stage 12 on which an object to be measured is mounted. The laser beam 7 is deflected by an acousto-optic deflector (AOD) 8 and is used to scan the surface of the object to be measured. The AOD 8 is a well known optical device employing a phenomenon wherein upon application of an ultrasonic wave to a material, a change in a refractive index is induced and light is diffracted. When an ultrasonic frequency is applied to the deflector 8, a zero-order light which is not diffracted, and a first-order light which is a high intensity light, can be acquired. The diffraction angle for the first-order light can be changed by altering the ultrasonic frequency. Therefore, the application of this phenomenon permits the first-order light to be used for scanning the surface of the object to be measured.

In this embodiment, the first-order light is employed for laser beam scanning, and the zero-order light obtained by the AOD 8 is employed as light for adjusting the focal point.

Referring to FIG. 3, a first-order light 10 diffracted by the AOD 8 irradiates an object to be measured via a focusing lens 3 on an irradiation side and scans it. A zero-order light 9 acquired without deflection also passes through the focusing lens 3. A mirror 11 is placed to adjust a focal point. Therefore, the mirror 11 is mounted on the stage 12 for an adjustment process of the optical system. The zero-order light 9 irradiating a surface 13 of the mirror 11 passes through a light reception side focusing lens 4 and a pin hole 14, which is located at the same position as that of the PSD 5, and is received by a camera or a PSD 15. In addition, the zero-order laser light 9 that irradiates the surface 13 of the mirror 11 is also examined by a camera 16, provided directly above the stage 12.

With the above arrangement, first, forcalization on the irradiation side is performed. Specifically, the stage 12 is raised or lowered, perpendicularly displacing the surface of the mirror 11. At this time, the size and the density of a point of light produced by the zero-order light 9, which irradiates the surface of the mirror 11, is examined by the camera 16 to detect the location of the focal point.

Figure 4:
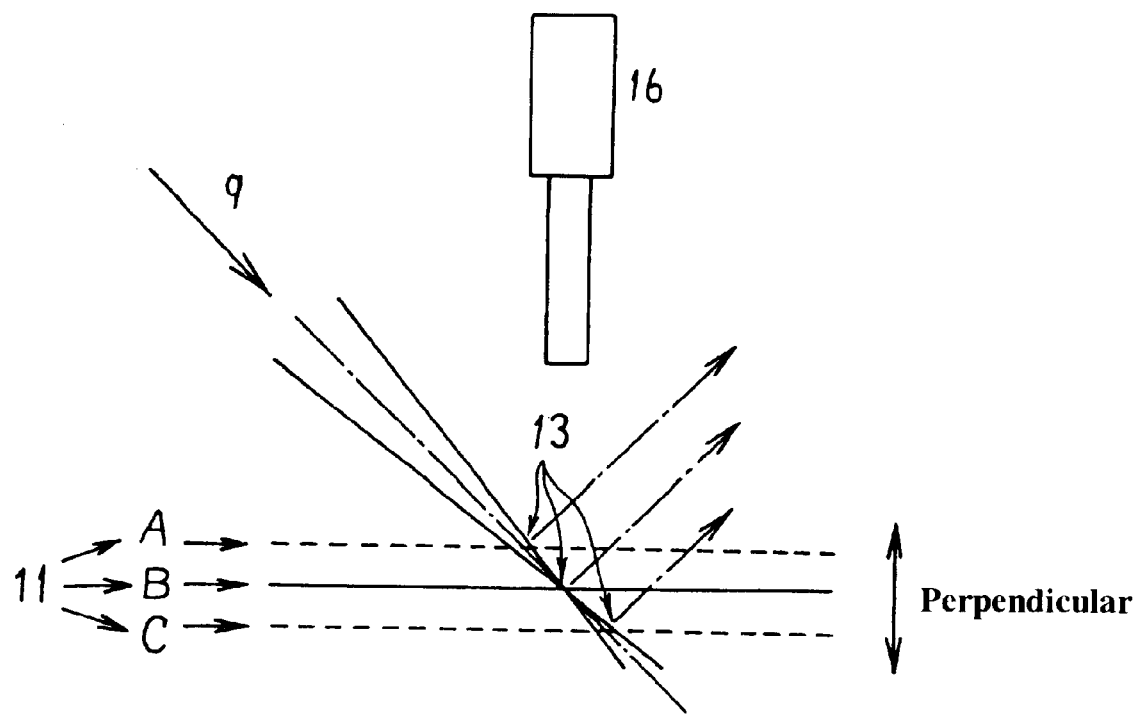
FIG. 4 is a diagram for explaining the adjustment for a focal point on a radiation side.
Figure 5A:
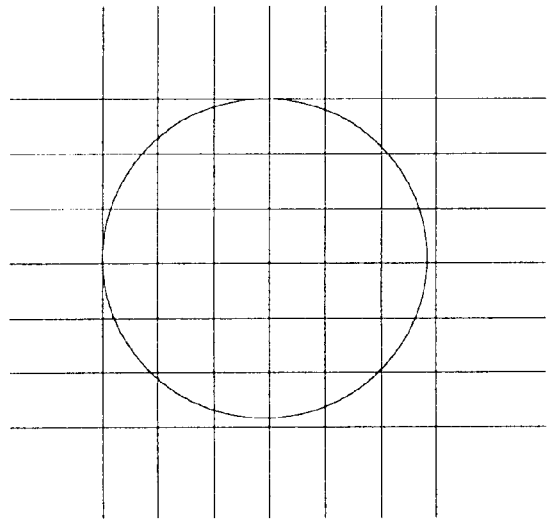
FIGS. 5A and 5B are diagrams for example light points on mirror surfaces captured by a camera.
Figure 5B:
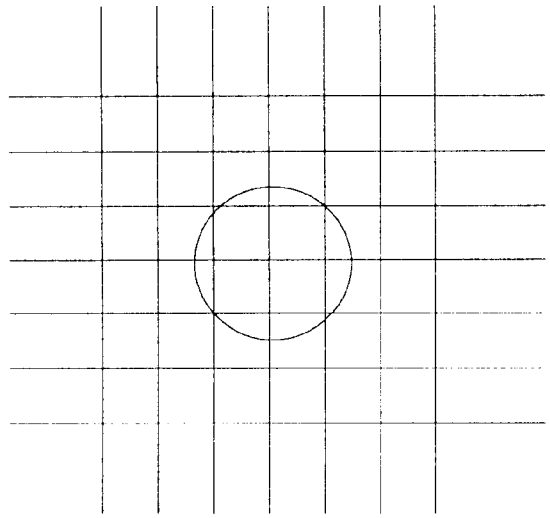

FIG. 4 is a diagram for explaining the focal point adjustment on the irradiation side, and FIGS. 5A and 5B are diagrams showing example points of light on the surface of the mirror 11 obtained by the camera 16. In the example in FIG. 4, when the surface of the mirror 11 is located at position B, the irradiation side is set to a focal point location. The focal depth of the camera 16 is adjusted to focus on one of the either positions A, B and C.

As shown in FIG. 5A, the light point images obtained by the camera 16 are blurred at positions A and C, as these are out of focus. On the other hand, as is shown in FIG. 5B, the light point image at focal point location B is sharply defined.

Figure 6A:
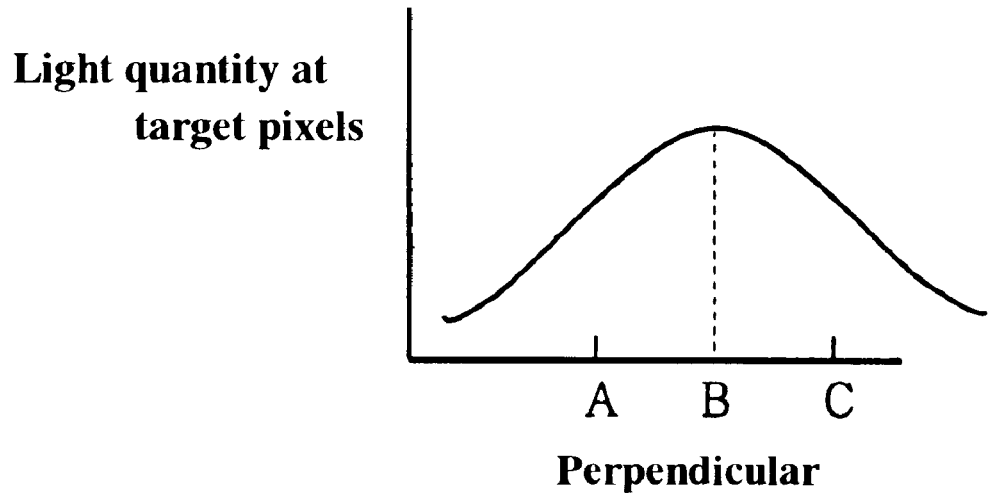
FIGS. 6A and 6B are graphs showing the analysis of an image captured by a camera.
Figure 6B:
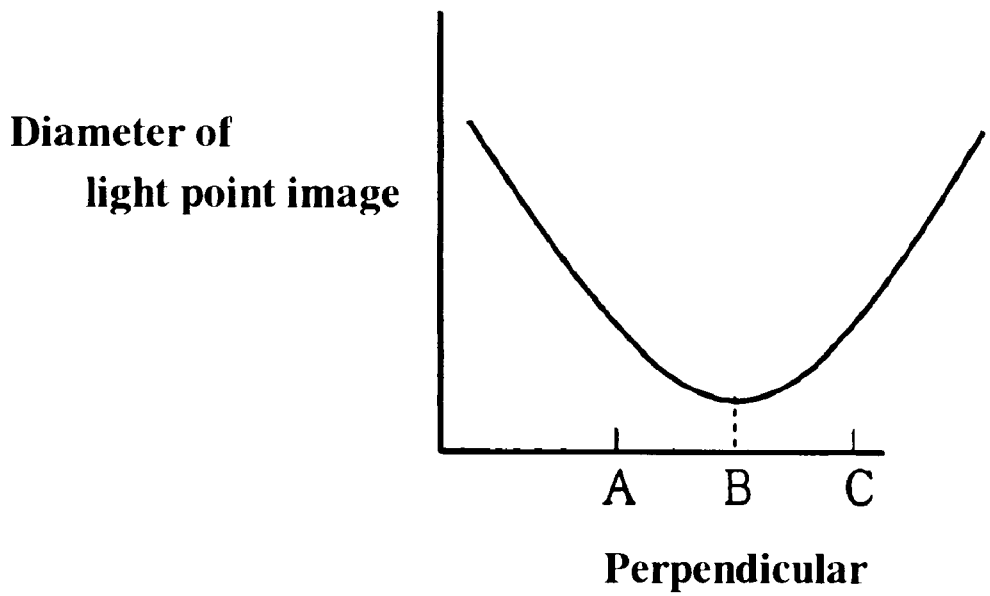

FIGS. 6A and 6B are graphs showing the results of an analysis of images obtained by the camera 16. In FIG. 6A, the change in light quantity at target pixels in the camera 16 as the mirror 11 is displaced is plotted. The target pixels are, for example, four pixels in the middle in FIGS. 5A and 5B. At focus position B, the light point image is the sharpest and the light quantity at the target pixels is the maximum possible. In FIG. 6B the change in the diameter of a light point image as the mirror 11 is displaced perpendicularly is plotted. As shown in FIGS. 5A and 5B, the diameter of the light point is the smallest at focal point location B. Thus, when a predetermined image process is performed for the light point image obtained by the camera 16, position B can be determined. By storing position B in memory during the focal point adjustment procedure, a succeeding object to be measured can also be situated at the focal point location.

Although the location of the focal point in the direction in which the mirror 11 is perpendicularly displaced has been detected, a focal point location may be detected by displacing the focusing lens 3 in the light axial direction.

Figure 7A:
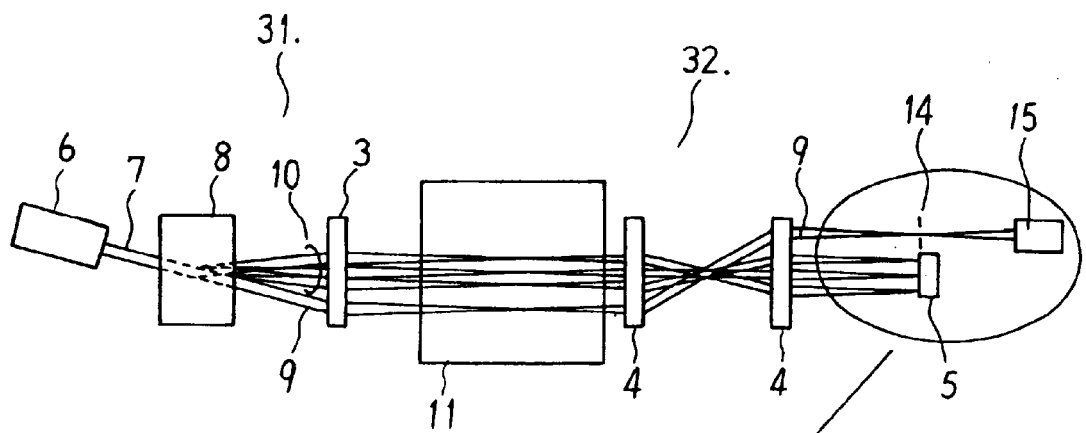
FIGS. 7A and 7B are diagrams for explaining the adjustment for a focal point at a light reception side.
Figure 7B:
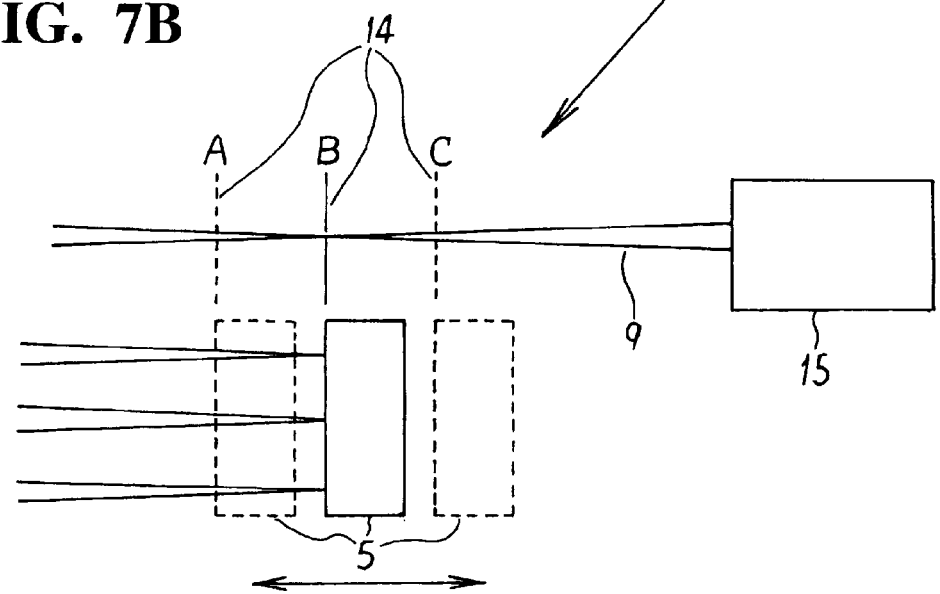

FIGS. 7A and 7B are diagrams explaining the adjustment of a focal point on a light reception side. FIG. 7A is a top view of the embodiment shown in FIG. 3. The same reference numerals as used in FIG. 3 are also used herein to denote corresponding components. In this example, a light point image detected by the camera or PSD 15 is examined in order to detect the focal point location on a light reception side 32, while a pin hole 14 provided along the same light point axis and moving with the PSD 5 is shifted along the light axis.

FIG. 7B is an enlarged diagram of the portion of the PSD 5, the pin hole 14 and the camera or PSD 15 shown in FIG. 7A. As was previously mentioned, the zero-order light 9 reflected by the mirror 11 passes through the focusing lens 4 and arrives at the pin hole 14. After passing through the pin hole 14, the light is obtained by the camera or PSD 15. While the pin hole 14 is displaced in the light axial direction together with the PSD 5, when the pin hole 14 arrives at the focal point location B on the light reception side 32, the quantity of light passing through the pin hole 14 is the maximum possible. Since the size of the laser beam 9 is several tens of $\mu$m at the focal point location, when the pin hole 14 is formed with a diameter of approximately 50 $\mu$m, a part of the zero-order laser beam 9 is blocked by the pin hole 14 at positions A and B, while the maximum light quantity is allowed to pass at the focal point location B.

Figure 8:
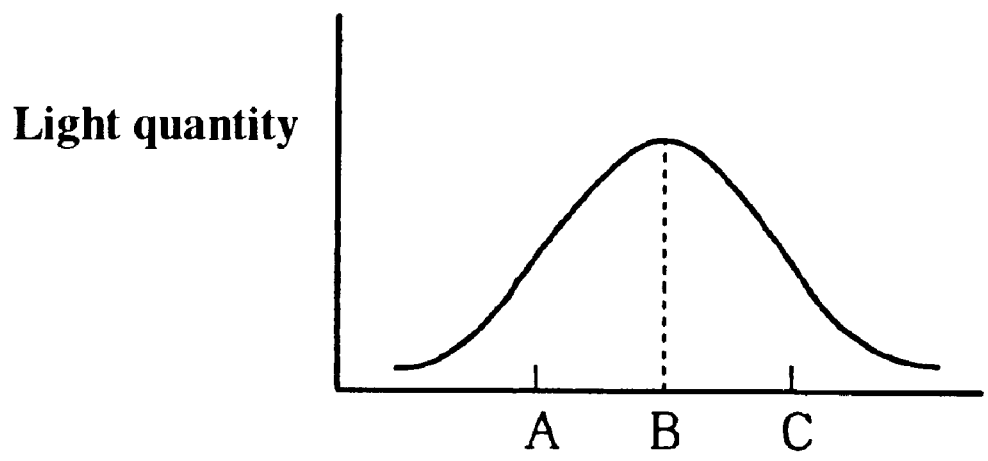
FIG. 8 is a graph showing the relationship between a light quantity detected by a camera or a PSD and the position in a light axial direction.

FIG. 8 is a graph showing the relationship between the light quantity detected by the camera or PSD 15 and the focal point location in the reflected light axial direction. When the pin hole 14 is located at position B, the quantity of light received by the camera or PSD 15 becomes a maximum. The position at which the maximum light quantity is acquired is detected by processing a photoelectric conversion current detected by the camera or PSD 15. The focal point location may be detected by moving the focusing lens 4 in the light axial direction. Or, the focusing lens 4 and the pin hole 14 may be moved at the same time to detect the focal point location.

In FIG. 7B, the position of the zero-order light 9 is shifted slightly in the horizontal direction by displacing the pin hole 14 along the light axis. In accordance with the horizontal movement, the quantity of light passing through the pin hole 14 is also slightly changed. An effective way to eliminate the possibility of such a change is to form an elliptically shaped pin hole 14 whose width is greater in the horizontal direction.

Figure 9:
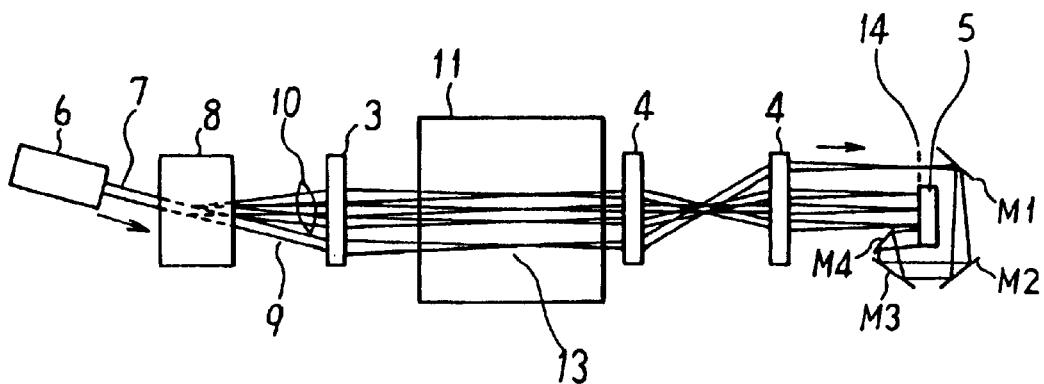
FIG. 9 is a diagram illustrating another embodiment of the present invention.

FIG. 9 is a diagram illustrating another embodiment for adjusting a focal point on a light reception side 32. This example differs from that shown in FIG. 7 in that a laser beam 9 passing through a pin hole 14 is guided to the PSD 5 by mirrors M1 through M4, instead of the camera or PSD 15 being provided behind the pin hole 14. The laser beam 9 may be guided by a prism or by an optical fiber rather than by the mirrors. According to this embodiment, for determination of the focal point location on the light reception side, displacement of the pin hole 14 and/or the light reception side focusing lens 4 in the light axial direction is initiated and continued until the position is reached where the maximum light quantity is detected by the PSD 5.

Figure 10:
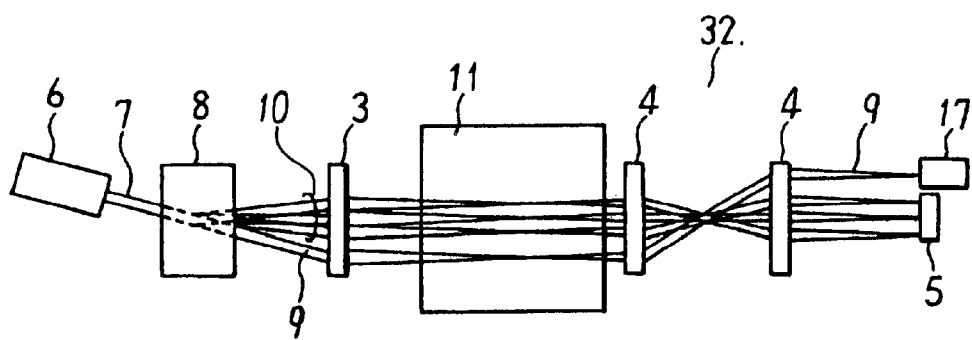
FIG. 10 is a diagram illustrating an additional embodiment of the present invention.

FIG. 10 is a diagram illustrating an additional embodiment for adjusting a focal point on a light reception side 32. This example differs from that shown in FIG. 7 in that instead of employing a pin hole 14, a camera 17 is provided in the exact position the pin hole 14 would occupy. When the zero-order light 9 forms an image directly on a camera 17 as in this embodiment, the position at which the smallest light point is formed, or the position at which the maximum light quantity impinges on a target pixel is designated as the focal point location, as explained while referring to FIGS. 4, 5 and 6.

Figure 11:
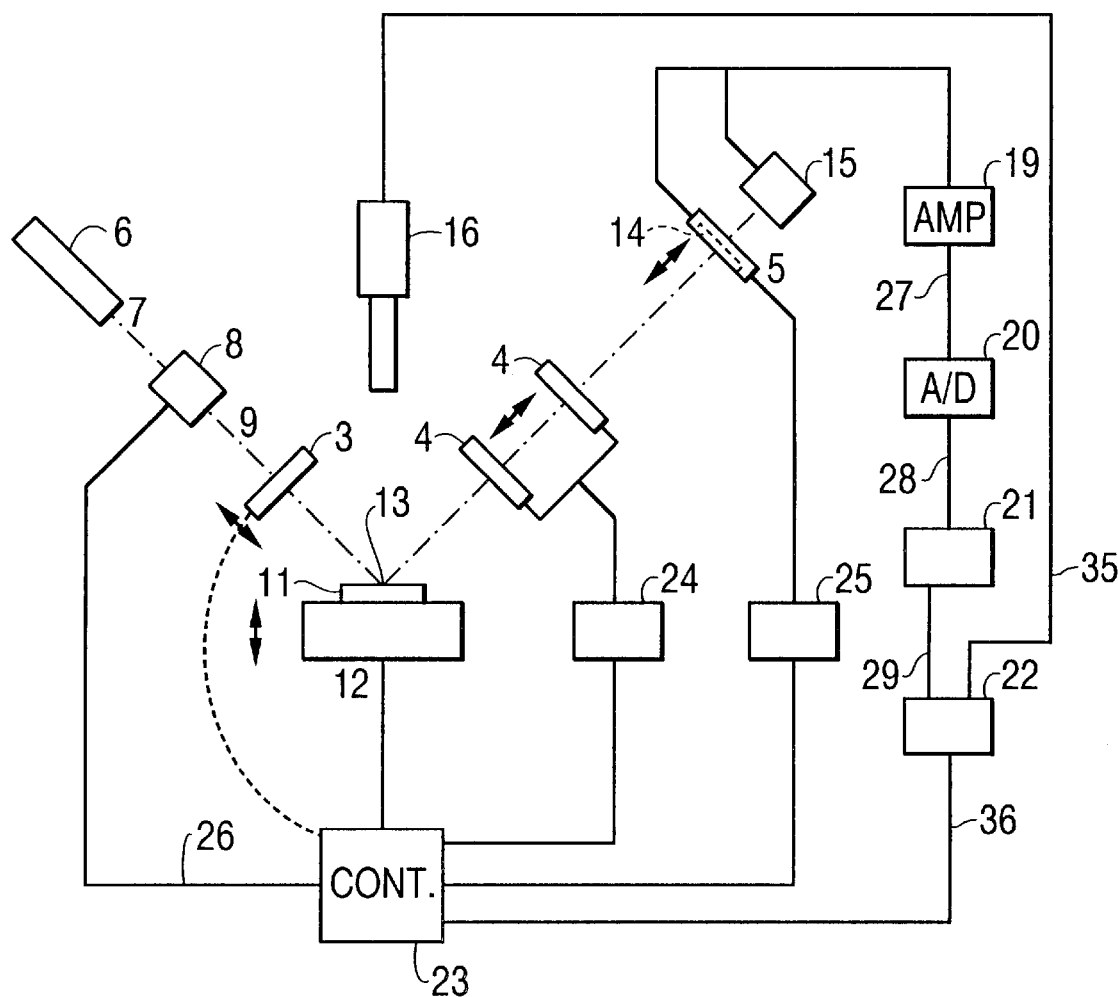
FIG. 11 is a block diagram illustrating the arrangement of a height measurement device according to the embodiments of the present invention.

FIG. 11 is a block diagram illustrating a height measurement device according to the embodiments of the present invention. This example has the same optical system as that shown in FIG. 3, and the same controller. Therefore, the same reference numerals used in FIG. 3 are used to denote corresponding components.

A controller 23 transmits to a deflector 8 a deflection control signal 26 for the deflection of a first-order light obtained from a laser beam 7 emitted by a laser beam source 6. In this example, a stage 12 is raised or lowered by the controller 23, and a focusing lens 4 is driven in the light axial direction by an adjustment driver 24. A PSD 5 is also driven in its light axial direction by an adjustment driver 25. These movements are controlled by the controller 23. In FIG. 11, a pin hole 14 is hidden behind the PSD 5, and an amplifier 19 amplifies a photoelectric conversion current detected by a camera or PSD 15 and changes the amplified current into a voltage. The camera or PSD 15 receives zero-order light 9, which has passed through the pin hole 14, and generates a voltage 27 corresponding to a quantity of light. The value 27 is converted into a digital value by an A/D converter 20, and the brightness at a light reception point is detected by a brightness/height calculation circuit 21, with the result being stored in a memory 22. The data for brightness stored in the memory 22 is read by the controller 23.

Thereafter, the amplifier 19 amplifies a current detected by the PSD 5, and, according to signals from two electrodes of the PSD 5, the brightness and height calculation circuit 21 detects the height which corresponds to the light reception position of the PSD 5. Photoelectric conversion signal data for each pixel obtained by the camera 16 is also stored in the memory 22.

Figure 12:
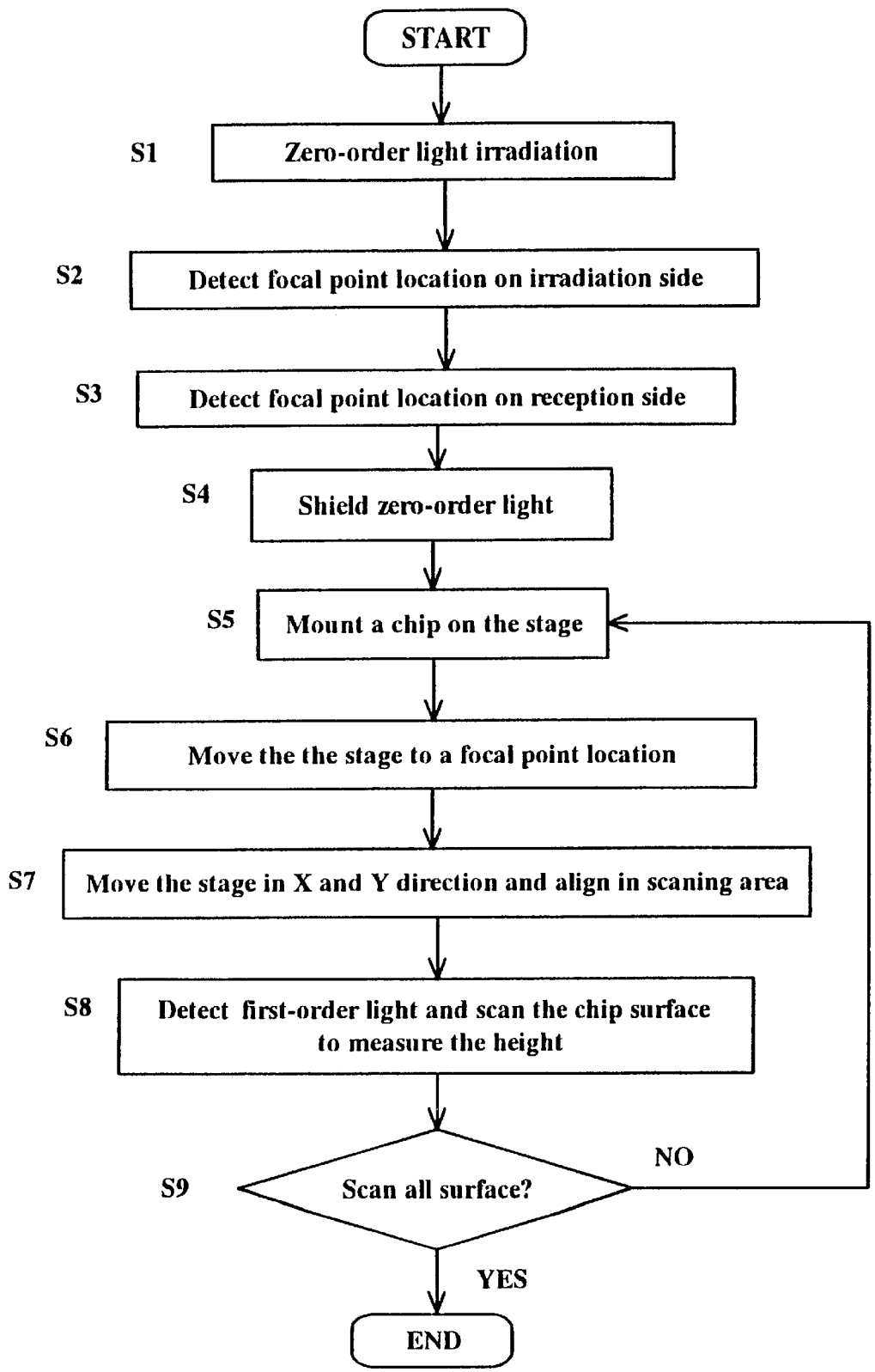
FIG. 12 is a flowchart of the process for measuring the height of a bump terminal.
Figure 13:
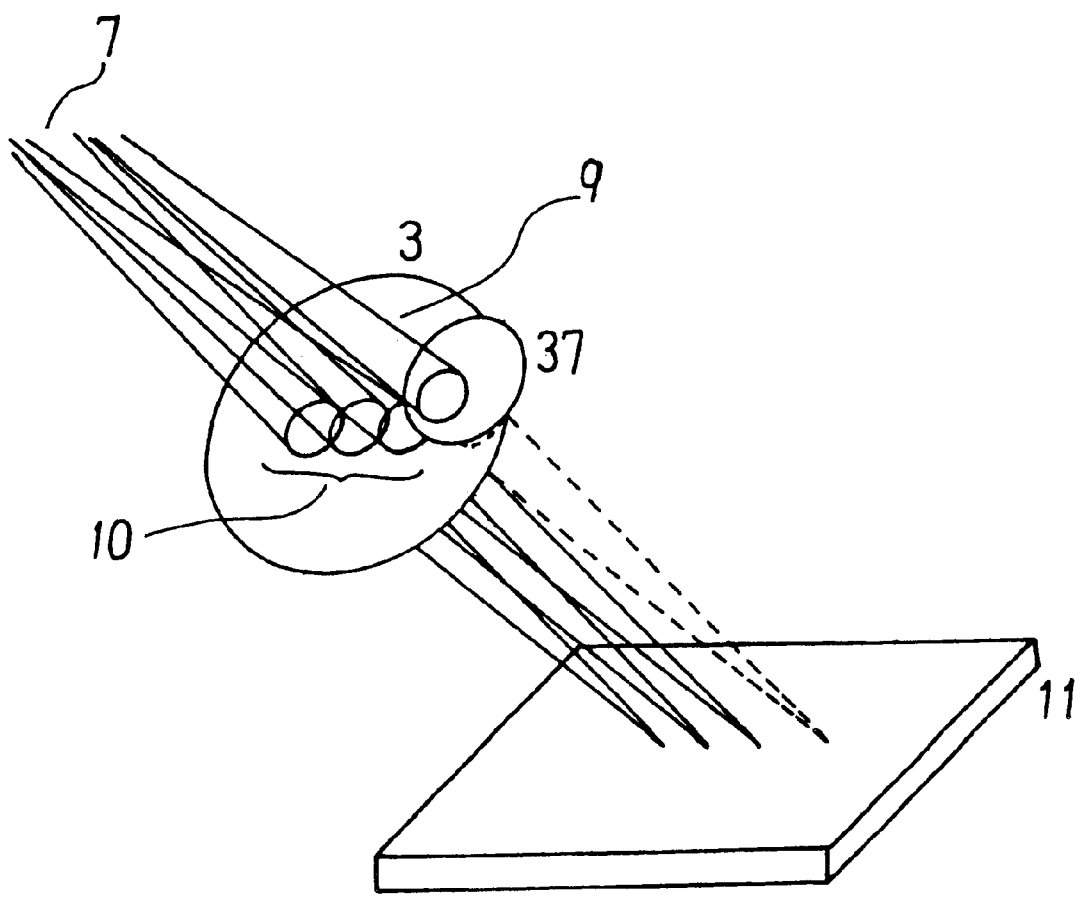
FIG. 13 is a diagram showing zero-order light shielding means provided in front of a radiation side focusing lens.

FIG. 12 is a flowchart for measuring a height using the height measurement device in FIG. 11, and FIG. 13 is a diagram showing a zero-order light shielding device positioned in front of an irradiation side focusing lens in the height measurement device in FIG. 11.

The height measurement processing will now be explained while referring to FIG. 12. First, the zero-order light 9, which is obtained from the laser beam 7 generated by the laser source 6, is projected (S1). The zero-order light 9 irradiates the focusing lens 3 by opening the zero-order shielding means 37 shown in FIG. 13. Then, first the optical system is adjusted to be positioned at the focal point, i.e., calibration. At step S2, while the stage 12 is displaced perpendicularly, the light point image of the zero-order light formed on the mirror 11 is obtained by the camera 16, and the image data is stored in the memory 22. The position at which the maximum light point image diameter is obtained by the camera 16, or the position at which the maximum light quantity impinges on a specific pixel, is detected during the image processing performed by the controller 23. The obtained position is the focal point location on the irradiation side.

Next, the optical system is adjusted to obtain a focal point location on the light reception side (S3). The light quantity detected at a light reception point by the camera or PSD 15 is monitored, while one, or both, of the focusing lens 4 and the PSD 5 are moved in the light axial direction by the controller 23. The position at which the maximum light quantity is received is the focal point location.

In this manner, the optical system is adjusted to obtain the focal point location, and then the projection of the zero-order light 9 used for the adjustment is interrupted by closing the shielding means 37 (S4).

Following this, the mirror 11 on the stage 12 is removed, and the semiconductor chip 1, an object to be measured, is placed thereon instead (S5). The stage 12 is then moved to the focal point location which was previously detected (S6). Following this, since the deflection range for the AOD 8 for the first-order light 10 is normally about 1 mm, the stage 12 is shifted in the X and Y directions, so that the first-order light 10 can scan a predetermined scanning area on the chip of 10 to 20 mm square (S7).

When the alignment of the scanning area has been completed, the first-order light 10 is deflected, in accordance with a deflection control signal 26 issued by the controller 23, and the stage 12 is moved in the direction perpendicular to the deflection direction, for example, so that the chip surface can be scanned. In accordance with the scanning, the height of the chip surface and the heights of the tops of the bumps are detected by the PSD 5. The controller 23 calculates the difference between the heights, and the height of each bump is measured (S8). The process at steps S7 and S8 is repeated as are steps S5 . S6, until the scanning of the entire chip surface is completed (S9).

Although the example bump terminals 2 are shown in the cross section in FIG. 2, so long as the top of a bump 2 is spherical and the irradiation side focal point is at least adjusted at that location, light reflected from the top of the bump 2 can be fully utilized. Therefore, at step S6 above, if a position slightly lower than the average height h of the bump tops is regarded as a focal point location, the accuracy of a measurement is enhanced the most. Of course, the location which should be a focal point location is determined in accordance with the shape of an object to be measured.

In the above embodiments, the zero-order light 9 of the laser beam 7 has been employed as a light for adjusting a focal point location, and the first-order light 10 has been employed for scanning. This is because the zero-order light 9 can be obtained in a direction which differs from that of the first-order light 10, and can thus be projected to the pin hole 14, which is positioned apart from but near the PSD 5.

The present invention, however, is not limited to using the zero-order light for adjustment, as the first-order light, for example, may also be used for this purpose. In this case, a camera or a PSD with a pin hole must be moved to the position where the camera 15 is located.

[Focus Adjustment Using Light Point Position Detector]

According to the focus adjustment method in the above embodiment, the camera 16 is used for adjusting the focus on the irradiation side, and pin holes are employed for adjusting the focus on the reflection side. However, the height of an object is actually measured by using the output of a light point position detector, such as a PSD (Position Sensitive Device), which detects the position of a light point which is reflected from the object. Therefore, if the output of the light point position detector can be employed for adjusting the focus, extra components are not necessary, and a controller can detect the focal position by performing signal processing for that output.

FIG. 14A is a diagram explaining the method for detecting a focal position on an irradiation side. A focus adjustment pattern 40 includes a first area 40A having a high reflectivity and a second area 40B having a lower reflectivity. More specifically, both areas 40A and 40B are formed as bands. For the focus adjustment pattern 40, a pattern made of metal, such as aluminum, having a high reflectivity is formed on a silicon substrate, and the metal pattern area is defined as the first area 40A and the surface of the silicon substrate is defined as the second area 40B.

According to the method in FIG. 14, the focus adjustment pattern 40 is mounted on the vertically displaceable stage 12 shown in FIG. 11, and is scanned by light emitted by the light source 6. The scanning is performed in a direction, such as is indicated by an arrow 41 in FIG. 11, that crosses the boundary between the highly reflective area 40A and the lower reflective area 40B. Incident light 10X is scanned in the direction indicated by the arrow 41, and reflected light 10Y impinges on a light point position detector 5, such as a PSD. At this time, the intensity of the projected light detected by the PSD 5 is monitored. The light intensity can be easily acquired by summing the values a+b for signals a and b, which are generated by two electrodes in the PSD 5.

The intensity of the light 10Y reflected from the highly reflective area 40A is high, and the intensity of the light 10Y reflected from the lower reflective area 40B is low. Therefore, whether or not a position corresponds to the focal point on the irradiation side can be determined by monitoring the changes detected in the light intensity when the light points are scanned from position t1 to t2 across the boundary of the two areas. That is, when a point of light forming an image on the focus adjustment pattern 40 is large and does not correspond to the focal point, there is a moderate change in the detected light intensity, as is indicated by broken line 43 in FIG. 14B. And when a point of light forming an image on the focus adjustment pattern 40 is small and corresponds to the focal point, there is a sharp change in the detected light intensity, as is indicated by solid line 42 in FIG. 14B.

In the height measurement device shown in FIG. 11, while the stage 12 is displaced perpendicularly, or while the focusing lens 3 on the irradiation side is shifted toward the light axis as shown by the arrow in FIG. 11, changes in the light intensity at various positions are monitored with the lens 3 being controlled by the controller 23. The location of the stage 12, or the location of the optical system on the irradiation side, whereat the change in the light intensity is sharpest, is determined to be the focal point position for the irradiation side. Thereafter, to measure the height of an object, the light reception side is set at the focal position determined for the stage 12.

Figure 15:
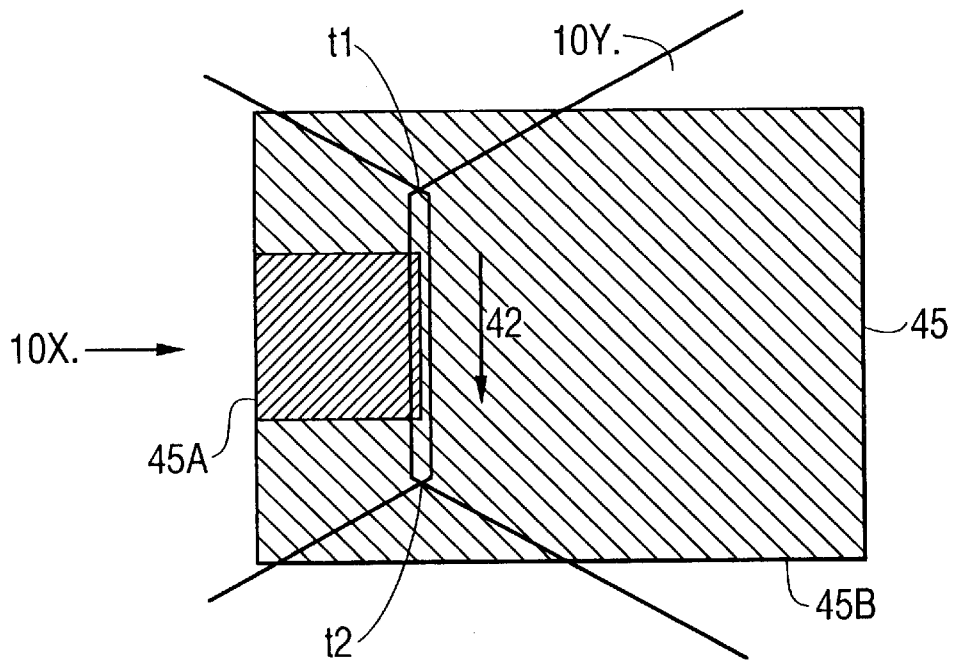
FIG. 15 is a diagram for explaining a method for detecting a focal position on a reflection side of a height measurement device.
Figure 16:
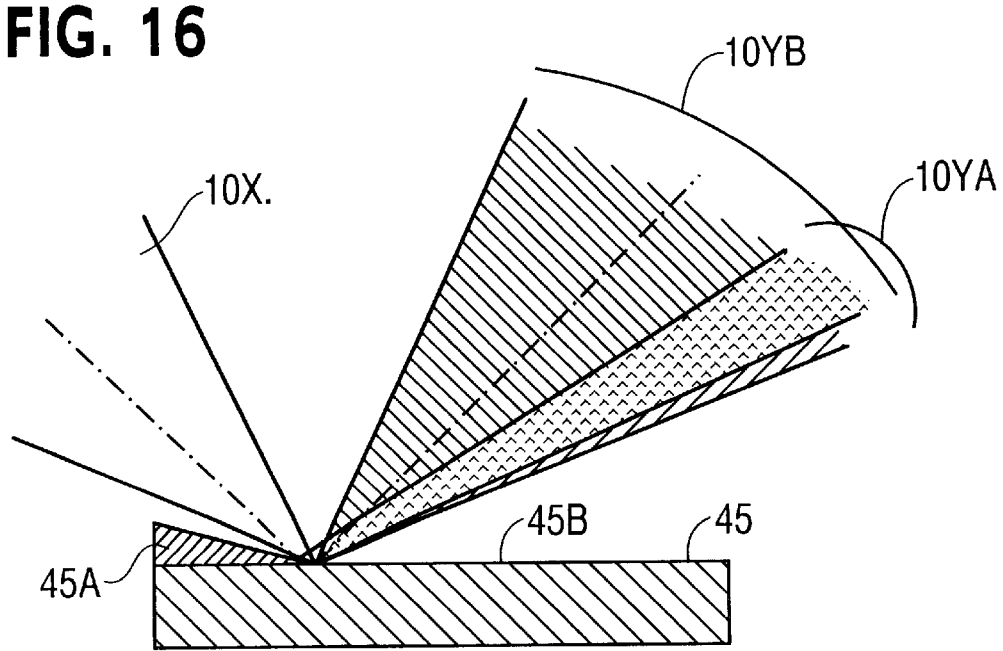
FIG. 16 is a diagram for explaining a method for detecting a focal position on a reflection side of the height measurement device.

FIGS. 15 and 16 are diagrams for explaining the method for detecting a focal point position on the reflection side of the height measurement device. For this method, a focus adjustment pattern 45 is employed that includes an area 45B wherefrom light 10YB is reflected at a predetermined angle or at a spread angle relative to incident light 10X, and an area 45A wherefrom light 10YA is reflected at a more inclined angle or at a more inclined spread angle relative to the incident light 10X. Light projected by the light source onto the focus adjustment pattern 45 is scanned along the boundary between the two areas 45A and 45B, as is indicated by arrow 42 in FIG. 15. For the focus adjustment pattern 45, an area having a predetermined inclination is, for example, formed on the surface (the area 45B) of a silicon substrate and is defined as the area 45A. In FIG. 15, the area 45A is wedge shaped. As the area 45A, an aluminum film is formed on the surface of the silicon substrate and the inclination formed at the edge of the aluminum film may be employed.

As is shown in FIG. 16, when light is scanned along the boundary, the incident light 10X projected onto the area 45B is reflected as the reflected light 10YB having a specified spread angle that is symmetrical to the light axis indicated by a chained line, as is shown in FIG. 16. The incident light 10X projected onto the area 45A is reflected as the reflected light 10YA having an inclined angle (a lower and less widely spread angle in FIG. 16) from the light axis, as is shown in FIG. 16.

Figure 17A:
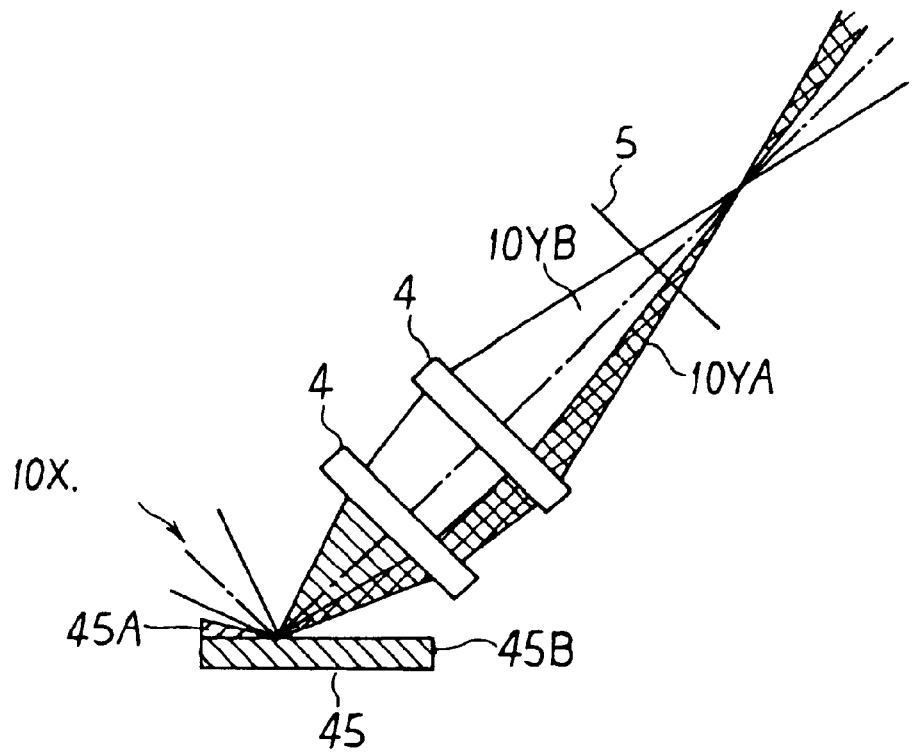
FIGS. 17A and 17B are diagrams for explaining the barycenter of the light intensity of a light point image detected by a light point position detector.
Figure 17B:
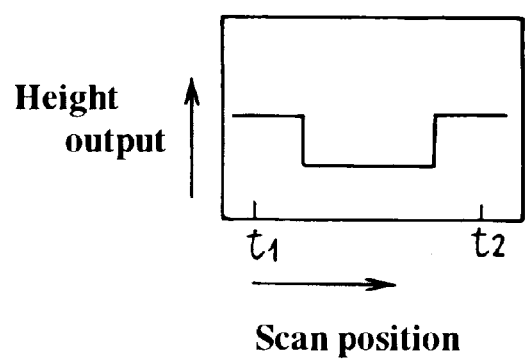
Figure 18A:
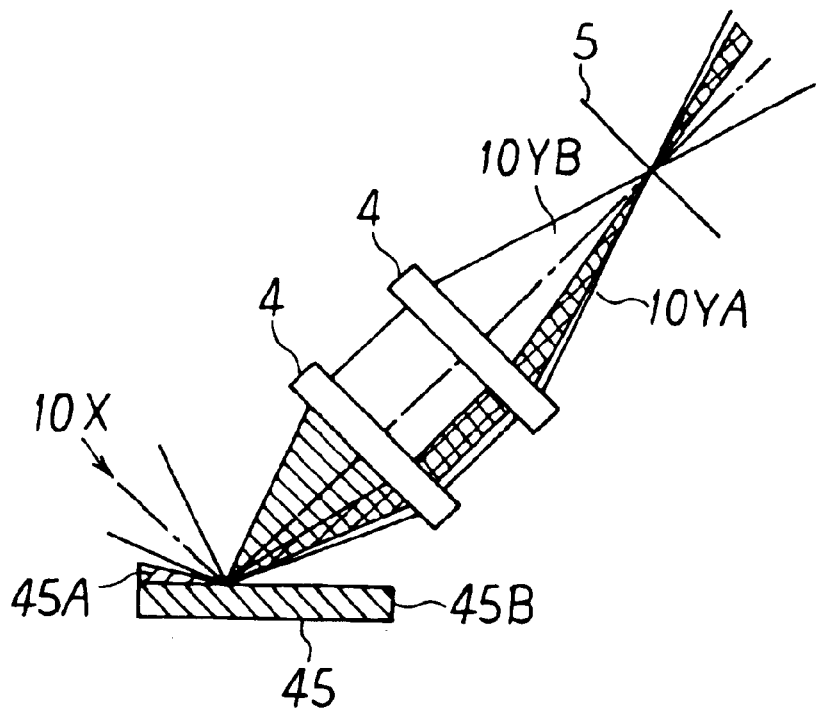
FIGS. 18A and 18B are diagrams for explaining the barycenter of the light intensity of the light point image detected by the light point position detector.
Figure 18B:
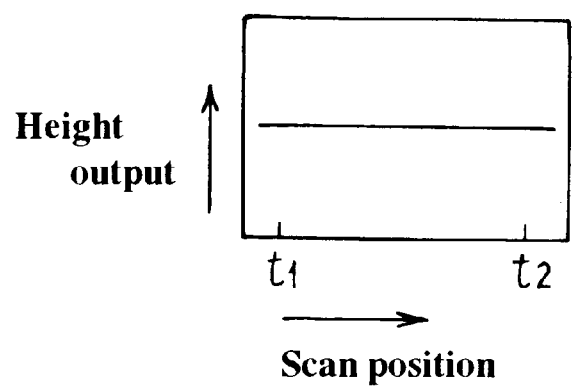

An explanation will be given of how the barycenter of the light intensity detected by the optical light position detector 5 is changed when the light points are scanned from position t1 to position t2 in the direction indicated by the arrow 42, as is shown in FIG. 15. FIGS. 17, 18 and 19 are diagrams for explaining the barycenter of the light intensity of an optical light image, detected by the light point position detector 5, when the position of the stage 12 is changed perpendicularly, or when the position of the optical system on the light reception side is changed. Changing the position of the optical system on the light reception side means that the positions of the focusing lens 4, the light point position detector 5 or the like are changed along the light axis. In FIGS. 17A and 17B, the condition wherein the focal point on the reception side is positioned to the rear of the light point position detector 5 is shown. In FIGS. 18A and 18B, the condition where the focal point on the reception side is the location for the focal point of the detector 5 is shown. FIGS. 19A and 19B, the condition where the focal point on the light reception side is positioned in front of the light point position detector 5 is shown. The barycenter of the light intensity of the optical light image is acquired from (a−b)/(a+b) where a and b denote the outputs of two of the electrodes of the PSD 5, which is the light point position detector. In the PSD, the location at the barycenter is normally used as a detection value indicating the height.

As is shown in FIGS. 15 and 16, when scanning with the incident light 10X is performed along the boundary between the areas 45A and 45B, the reflected lights 10YA and 10YB are formed. In other words, the quantity of light reflected to the focusing lens 4 is inclined toward the lower side as shown in FIGS. 17, 18 and 19.

In the case where the focal point is to the rear in FIG. 17A, therefore, because of the presence of the reflected light 10Y, the barycenter of the light intensity for the light point image, which is formed on the light point position detector 5, is shifted and lies below the light axis indicated by the chained line. When the light is used to scan from point t1 to point t2 in FIG. 15, therefore, the reflected light 10YB relative to the area 45B is widely spread, with the light axis as the center, and the barycenter of the light intensity corresponds to the light axis. However, when the light scans along the boundary between the 45A and 45B, the detected barycenter of the light intensity is shifted toward the lower side. When the light scans position t2, the barycenter of the light intensity corresponds to the light axis. In FIG. 17B is shown the height output (the position of the barycenter of the light intensity) detected by the PSD 5 relative to the scanning position. As is shown in FIG. 17B, the height output is lowered during the scanning.

In the case of the focal point location shown in FIG. 18A, where the reflected light 10YA, as well as the light 10YB, forms an image along the light axis of the light point position detector 5, the height output is a constant value, regardless of the scanning position, as is shown in FIG. 18B.

In the case of the focal point location shown in FIG. 19A, because of the presence of the reflected light 10YA, the barycenter of the light intensity for the light point image, formed on the light point position detector 5, is shifted upward from the light axis indicated by the chained line. When the light is used to scan from point t1 to point t2 in FIG. 15 along the boundary between the areas 45A and 45B, the barycenter of the light intensity is shifted upward. In other words, the change in the height output is detected, as is shown in FIG. 19B.

As is shown in FIGS. 17B, 18B and 19B, the position of the stage, or the position of the light reception side optical system is changed, and when the light point is scanned at each position, the position of the barycenter of the light intensity detected by the PSD 5 is monitored. When a constant waveform shown in FIG. 18B is detected at a specific location, regardless of the scanning position, that location is determined to be the focal point on the reflection side. The object is set on the stage at that focal point and its height is measured.

FIG. 20 is a diagram showing the structure where a pattern 47 made of a metal, such as aluminum, is formed as a focus adjustment pattern on a silicon substrate 46. The edge portion of the metal pattern 47 is used as an area 46A where the spread angle of reflected light is inclined, like the reflected light 10YA. The surface of the silicon substrate 46 is employed as an area 46B where reflected light 10YB is spread symmetrically in the light axis direction. When the flat portion of the metal pattern 47 is exposed, it is apparent that reflected light, like the light 10YB, has a spread angle that is symmetrical to the light axis.

Figure 21A:
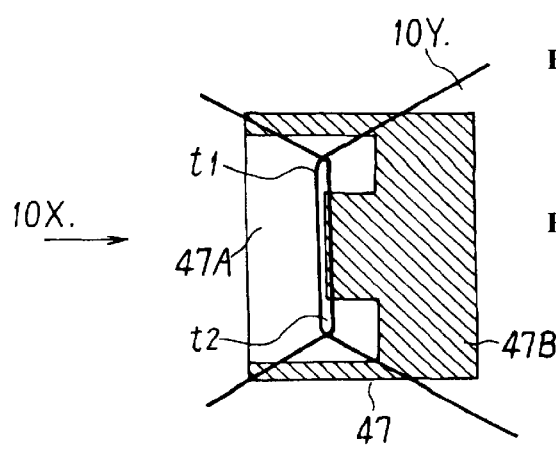
FIGS. 21A and 21B are diagrams for explaining a focal point adjustment method when a focal point adjustment pattern is employed for which a metal pattern is formed on a silicon surface.
Figure 21B:
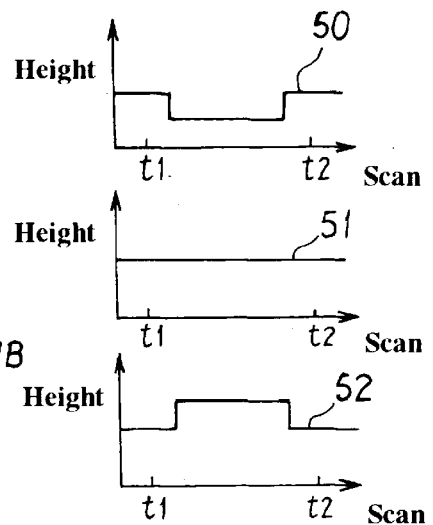

FIGS. 21A and 21B are diagrams explaining a focus adjustment method by using a focus adjustment pattern 47 where a metal pattern 47A in FIG. 20 is formed on a silicon surface 47B. As is shown in FIG. 21A, for the focus adjustment pattern 47, the incident light 10X scans the metal pattern 47A, the boundary of the silicon surface 47B, and again the metal pattern 47A. In this case also, as is shown in FIG. 21B, the height position is detected as a waveform 50 when the focal point is to the rear of the PSD 5, as a waveform 51 when the focal point is located at the focal position of the PSD 5, and as a waveform 52 when the focal point is in front of the PSD 5. The position where the waveform 51 is acquired is determined to be the focal position.

In the example in FIG. 21, unlike the example in FIG. 15, the incident light constantly scans the metal pattern that is highly reflective. Thus, the difference in the intensities of the reflected light from scanning position t1 to position t2 is small, and even when the dynamic range of the light point position detector 5, such as a PSD, is comparatively narrow, the intensity can be correctly detected.

Figure 22A:
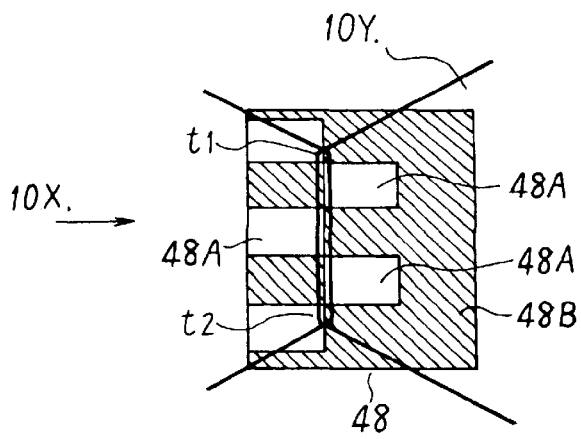
FIGS. 22A and 22B are diagrams for explaining a focal point adjustment method when another focal point adjustment pattern is employed for which a metal pattern is formed on a silicon surface.
Figure 22B:
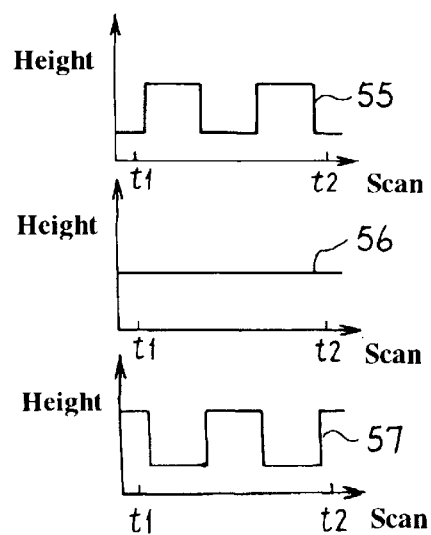
Figure 23:
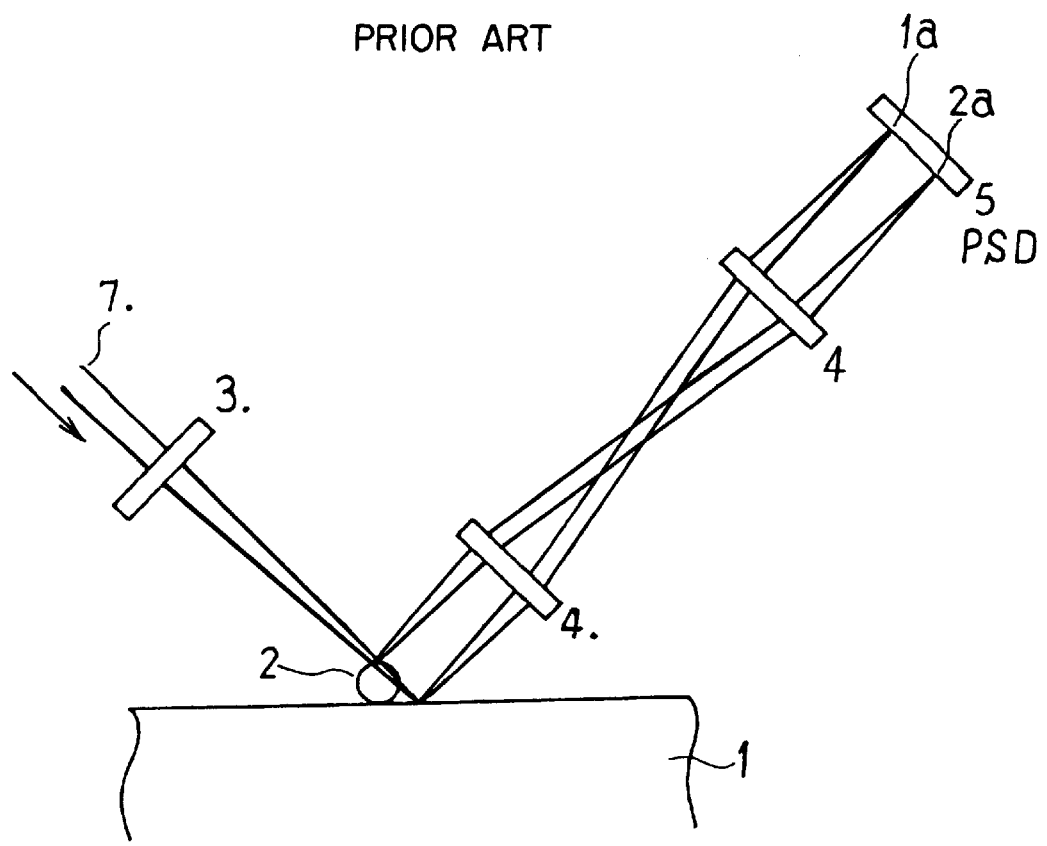
FIG. 23 is a diagram showing the principle of a triangulation method.

FIGS. 22A and 22B are diagrams explaining the focus adjustment method when another focus adjustment pattern 48 is employed. For this focus adjustment pattern 48, a metal pattern 48A and a silicon surface 48B are formed in reverse along the scanning direction. Therefore, when light scans from position t1 to position t2, and the focal point is to the rear of the PSD 5, the detected height is greatly changed as in a waveform 55. In the case where the focal point is in front of the PSD 5, the detected height is changed greatly, as is shown by a waveform 57, and in the direction opposite to that for the focal point that is to the rear. In the case where the focal point is located at the PSD 5, the detected height is constant as is shown by a waveform 56.

In the example in FIG. 22, as the waveform for the detected height changes greatly when the focal point is not located at the PSD 5, it is apparent that for this example the accuracy in the detection of the focal position is higher than it is for the examples in FIGS. 15 and 21.

According to the methods explained while referring to FIGS. 14 through 22, the focal position can be detected by using the output of the light point position detector 5, such as a PSD, which is employed for normal height measurement. Therefore, the height measurement device can be easily adjusted. As is shown in FIG. 11, the calculator 21 employs the output of the light point position detector 5 to acquire the light intensity (a+b) and the barycenter position of the light intensity, (a−b)/(a+b). Therefore, since the waveform is monitored while the position of the stage 12 and of the optical system is changed by the controller 23, the focal point of the height measurement device can be determined.

As is described above, according to the present invention, the focal point locations of the optical system on the irradiation side and of the optical system on the light reception side can be easily adjusted, and the following height measurement process can be performed accurately by setting a focal point at a desired location.

In addition, the focal positions on the irradiation side and on the light reflection side can be easily adjusted by employing an output of the light point position detector, which is provided on the reception side, using the focus adjustment pattern.

What is claimed is:

1. A height measurement device, which forms an image of a light point generated by a light source, which is not ambient light, on a surface of a measured object via an irradiation side focusing lens, which forms an image of said formed image of the light point on a light point position detector via a light reception side focusing lens, and which measures a height of said measured object according to the light point position on said light point position detector, comprising:

a stage perpendicularly movable with said measured object mounted thereon;

a camera for obtaining a light point image formed on a target face on said stage; and a controller for detecting a position of one of said stage and a radiation focusing lens as a focal point, at which a light quantity on a predetermined pixel in said light point image obtained by said camera becomes a maximum level, while moving one of said stage and said radiation focusing lens; and deflection means for deflecting a laser beam generated by said light source and for separating a zero-order light from a first order light, wherein said zero-order light is employed as a light for detecting said focal point position and said first-order light is employed as a light for measuring a height of said measured object.

2. A height measurement device, which forms an image of a light point generated by a light source, which is not ambient light, on a surface of a measured object via an irradiation side focusing lens, which forms an image of said formed image of the light point on a light point position detector via a light reception side focusing lens, and which measures a height of said measured object according to the light point position on said light point position detector, comprising:

a stage perpendicularly movable with said measured object mounted thereon;

a camera for obtaining a light point image formed on a target face on said stage;

a controller for detecting a position of one of said stage and a radiation side focusing lens as a focal point, at which the size of said light point image obtained by said camera becomes smallest, while moving one of said stage and said radiation focusing lens; and a deflector deflecting a laser beam generated by the light source and separating a zero-order light from a first order light, wherein the zero-order light is employed as a light for detecting said focal point position and the first-order light is employed as a light for measuring a height of the measured object.

3. A height measurement method, wherein an image of a light point generated by a light source, which is not ambient light, is formed on a surface of measured object via an irradiation side focusing lens, an image of said formed image of the light point is formed on a light point position detector via a light reception side focusing lens, and height of said measured object is measured according to said light position point on said light point position detector, said method comprising:

moving one of a perpendicularly movable stage and said irradiation side focusing lens and obtaining said light point image formed on a target face on said stage by a camera provided above said stage;

detecting a position of one of said stage and a radiation side focusing lens as a focal point location where a light quantity on a specific pixel of said light point image obtained by said camera becomes a maximum level; and deflecting a laser beam generated by a light source and splitting the laser beam to obtain a zero-order light and a first-order light, the zero-order light being employed as a light for detecting the focal point and the first-order light being employed as a light for measuring a height of the object to be examined.

4. A height measurement method, wherein an image of a light point generated by a light source, which is not ambient light, is formed on a surface of an object to be measured via a focusing lens on an irradiation side, an image of said formed image of said light point is formed on a light point position detector via a focusing lens on a light reception side, and a height of said object to be measured is determined in accordance with said light position point on said light point position detector, said method comprising:

mounting, on a perpendicularly displaceable stage, a focal point adjustment pattern including a first area having a first reflective coefficient and a second area having a second reflective coefficient lower than the first reflective coefficient;

scanning a light point generated by said light source across a boundary between said first and said second areas of said focal adjustment pattern, and monitoring a change in light intensity of a light point formed on said light point position detector;

detecting one of a position of said stage and a position of an optical system on an radiation side where said change in said light intensity is most sharply defined; and measuring a height of said object at one of said position of said stage and said position of said optical system on said radiation side.

5. A height measurement device according to 4, wherein scanning of said focal point adjustment pattern employing said light point includes first scanning on said first or said second area and second scanning along said boundary between said first and said second areas, and said focal position is detected when said barycenter of said light intensity is not changed at the time of said first scanning and at the time of said second scanning.

6. A height measurement device according to 4, wherein scanning of said focal point adjustment pattern employing said light point includes first scanning performed along a first boundary between said first and said second areas, and second scanning performed along a second boundary between said first area and said second area, a positional relationship of said first area and said second area along said second boundary is opposite to that along said first boundary, and said focal position is detected when said barycenter of said light intensity is not changed at the time of said first scanning and at the time of said second scanning.

7. A height measurement method, wherein an image of a light point generated by a light source, which is not ambient light, is formed on a surface of an object to be measured via a focusing lens on an irradiation side, an image of said formed image of said light point is formed on a light point position detector via a focusing lens on a light reception side, and a height of said object to be measured is determined in accordance with said light position point on said light point position detector, said method comprising:

mounting, on a perpendicularly displaceable stage, a focal point adjustment pattern including a first area where reflected light relative to radiated light has a first angle and a second area where reflected light has a second angle biased relative to said first angle;

scanning a light point generated by said light source along a boundary between said first and said second areas of said focal adjustment pattern, and monitoring a barycenter of a light intensity of a light point formed on said light point position detector;

detecting one of a focal position of said stage and an optical system on a light reception side according to said barycenter of said light intensity; and measuring a height of said object at one of said focal position of said stage and said position of said optical system on said irradiation side.

8. A height measurement method, wherein an image of a light point generated by a light source, which is not ambient light, is formed on a surface of measured object via an irradiation side focusing lens, an image of said formed image of the light point is formed on a light point position detector via a light reception side focusing lens, and height of said measured object is measured according to said light position point on said light point position detector, said method comprising:

moving one of a perpendicularly movable stage and said irradiation side focusing lens and obtaining said light point image formed on a target face on said stage by a camera provided above said stage;

detecting a position of one of said stage and a radiation side focusing lens as a focal point location where a size of said light point image obtained by said camera becomes smallest; and deflecting a laser beam generated by a light source and for splitting the laser beam to obtain a zero-order light and a first-order light, the zero-order light being employed as a light for detecting the focal point and the first-order light being employed as a light for measuring a height of the object to be examined.

9. A height measurement device, which forms an image of a light point generated by a light source on a surface of a measured object via an irradiation side focusing lens, which forms an image of said formed image of the light point on a light point position detector via a light reception side focusing lens, and which measures a height of said measured object according to the light point position on said light point position detector, comprising:

pin hole means, provided at the substantially same position as said light point poisition detection device in a light axial direction, and movable in said light axial direction together with said light point position detector;

light quantity detector detecting a quantity of light passed through said pin hole means;

a controller detecting a position of said pin hole means or of said light reception side focusing lens as a focal point, at which said quantity of light detected by said light quantity detectors becomes a maximum level, while moving said pin hole means or said light reception side focusing lens in said light axial direction; and a deflector deflecting a laser beam generated by the light source and separating a zero-order light from a first order light, wherein the zero-order light is employed as a light for measuring a height of the measured object.

10. A height measurement device, which forms an image of a light point generated by a light source on a surface of a measured object via an irradiation side focusing lens, which forms an image of said formed image of the light point on a light point position detector via a light reception side focusing lens, and which measures a height of said measured object according to the light point position on said light point position detector, comprising:

a camera, provided at the substantially same position as said light point position detector in a light axial direction, and movable in said light axial direction together with said light point position detector; and a controller detecting a position of said camera or of said light reception side focusing lens as a focal point, at which said light point image obtained by said camera becomes the smallest, while moving said camera or said light reception side focusing lens; and a deflector deflecting a laser beam generated by the light source and separating a zero-order light from a first order light, wherein the zero-order light is employed as a light for detecting said focal point position and the first-order light is employed as a light for measuring a height of the measured object.

11. A height measurement device, which forms an image of a light point generated by a light source on a surface of a measured object via an irradiation side focusing lens, which forms an image of said formed image of the light point on a light point position detector via a light reception side focusing lens, and which measures a height of said measured object according to the light point position on said light point position detector, comprising:

a camera, provided at the substantially same position as said light point position detector in a light axial direction, and movable in said light axial direction together with said light point position detector; and a controller detecting a position of said camera or of said light reception side focusing lens as a focal point, at which a light quantity on a predetermined pixel at said light point image obtained by said camera becomes a maximum level, while moving said camera or said radiation side focusing lens in said light axial direction; and a deflector deflecting a laser beam generated by the light source and separating a zero-order light from a first order light, wherein the zero-order light is employed as a light for detecting said focal point position and the first-order light is employed as a light for measuring a height of the measured object.

12. A height measurement device, which forms an image of light point generated by a light source on a surface of a measured object via an irradiation side focusing lens, which forms an image of said formed image of the light point on a light point position detector via a light reception side focusing lens, and which measures a height of said measured object according to the light point position on said light point position detector, comprising:

pin hole means, provided at the substantially same position as said light point position detection device in a light axial direction, and movable in said light axial direction together with said light point position detector;

light guide means for guiding the light passed through said pin hole means to said light point location detector; and a controller detecting a position of said pin hole means or of said light reception side focusing lens as a focal point, at which said quantity of said light, which has passed through said pin hole means andis detected by said light quantity detection means, becomes a maximum level, while moving said pin hole means or said light reception side focusing lens in said light axial direction; and a deflector deflecting a laser beam generated by the light source and separating a zero-order light from a first order light, wherein the zero-order light is employed as a light for detecting said focal point position and the first-order light is employed as a light for measuring a height of the measured object.

13. A height measurement method, wherein an image of a light point generated by a light source is formed on a surface of a measured object via an irradiation side focusing lens, an image of said formed image of the light point is formed on a light point position detector via a light reception side focusing lens, and a height of said measured object is measured according to said light position point on said light point position detector, comprising the steps of:

deflecting a laser beam emitted by said light source and separating a zero-order light from a first-order light;

moving said light point position detector or said light reception side focusing lens in a light axial direction;

detecting a position of said light point position detector or of said light reception side focusing lens as a focal point location, whereat a maximum quantity of said zero-order light irradiates at a location, which is substantially same position as said light point location detector in said light axial direction and which is movable together with said light point location detector in said light axial direction, or whereat a size of said light point image of said zero-order light irradiated at said location becomes the smallest; and deflecting a laser beam generated by the light source and separating a zero-order light from a first order light, wherein the zero-order light is employed as a light for detecting said focal point position and the first-order light is employed as a light for measuring a height of the measured object.

* * * * *

UNITED STATES PATENT AND TRADEMARK OFFICE
CERTIFICATE OF CORRECTION

PATENT NO.: 6,052,189
DATED : April 18, 2000
INVENTOR(S): Takashi FUSE, et al.

It is certified that errors appear in the above-identified patent and that said Letters Patent is hereby corrected as shown below:

Col. 15, line 42, after "for" insert --detecting said focal point position and the first-order light is employed as a light for--.

Col. 16, line 43, change "andis" to --and is--.

Signed and Sealed this

Sixth Day of February, 2001

Attest:

Attesting Officer

Q. TODD DICKINSON
Director of Patents and Trademarks